United States Patent
Griffin, Jr. et al.

(10) Patent No.: US 7,323,409 B2
(45) Date of Patent: Jan. 29, 2008

(54) METHOD FOR FORMING A VOID FREE VIA

(75) Inventors: Alfred J. Griffin, Jr., Dallas, TX (US); Adel El Sayed, Dallas, TX (US); John P. Campbell, Garland, TX (US); Clint L. Montgomery, Coppell, TX (US)

(73) Assignee: Texas Instruments Incorporated, Dallas, TX (US)

(*) Notice: Subject to any disclaimer, the term of this patent is extended or adjusted under 35 U.S.C. 154(b) by 224 days.

(21) Appl. No.: 11/053,313

(22) Filed: Feb. 7, 2005

(65) Prior Publication Data

US 2005/0146035 A1  Jul. 7, 2005

Related U.S. Application Data

(62) Division of application No. 10/385,824, filed on Mar. 11, 2003, now Pat. No. 6,977,437.

(51) Int. Cl.
*H01L 21/768* (2006.01)
(52) U.S. Cl. .................. 438/629; 438/622; 438/627; 257/E21.575
(58) Field of Classification Search .......... 438/627, 438/622, 629; 257/E21.575
See application file for complete search history.

(56) References Cited

U.S. PATENT DOCUMENTS

| 5,312,775 | A | * | 5/1994 | Fujii et al. ............... 438/625 |
| 5,360,995 | A | | 11/1994 | Graas ..................... 257/751 |
| 5,824,597 | A | * | 10/1998 | Hong ..................... 438/625 |
| 5,827,777 | A | | 10/1998 | Schinella et al. .......... 438/629 |
| 5,874,358 | A | * | 2/1999 | Myers et al. ............. 438/640 |
| 5,918,149 | A | | 6/1999 | Besser et al. ............. 438/680 |
| 6,329,718 | B1 | | 12/2001 | Van Ngo et al. ........... 257/765 |
| 6,333,261 | B1 | | 12/2001 | Lin et al. ................ 438/656 |
| 6,368,958 | B2 | * | 4/2002 | Ho et al. ................. 438/637 |
| 2002/0096768 | A1 | | 7/2002 | Joshi .................... 257/750 |

* cited by examiner

Primary Examiner—Thomas Dickey
Assistant Examiner—Victor A. Mandala, Jr.
(74) Attorney, Agent, or Firm—Yingsheng Tung; Wade James Brady, III; Frederick J. Telecky, Jr.

(57) ABSTRACT

A multilevel metal and via structure is described. The metal conductors include a base or seed layer, a bulk conductor layer, a capping layer, and a barrier layer, and the via structure include a seed layer, a diffusion barrier layer and a metal plug.

The via seed layer is controlled to a thickness that discourages the reaction between the via seed layer and the bulk conductor layer. The reaction may result in the formation of harmful voids at the bottom of the vias and is caused by having the via seed metal coming in contact with the bulk conductor through openings in the barrier layer.

6 Claims, 2 Drawing Sheets

METHOD FOR FORMING A VOID FREE VIA

This is a divisional of application Ser. No. 10/385,824 filed on Mar. 11, 2003 now U.S. Pat. No. 6,977,437, which is incorporated, in its entirety, herein by reference.

FIELD OF THE INVENTION

The present invention relates to the manufacture of semiconductor devices, and more particularly to a method for forming vias in semiconductor devices.

BACKGROUND OF THE INVENTION

A continuing trend in semiconductor integrated circuit manufacturing is to make more powerful and complex integrated circuit devices in a smaller area. Manufacturers achieve this objective by making individual circuit component sizes smaller and by locating these components closer together. Millions of active and passive circuit components, such as transistors, capacitors, and resistors are formed on a semiconductor substrate. These circuit components are formed electrically isolated from each other on the substrate and later are interconnected to form functional circuits. The quality of these interconnecting structures greatly affects the performance, and reliability of the completed integrated circuits.

Often the interconnections are fabricated as a multilayer structure having alternating layers of patterned metallic and dielectric materials. The dielectric layers, frequently a form of silicon oxide, serve to separate the conductors, both vertically and horizontally, and very small, vertical metal filled vias in the dielectric layers provide a means of interconnection between the metal levels.

In multilevel structures, the metal conductors may include a base or seed layer, a bulk conductor layer, a capping layer, and a barrier layer, and the sum of these layers is referred to as a metal stack. The metal stack is formed on a dielectric layer and then etched, through the use of photolithographic techniques, to define the interconnecting structure.

A typical via structure formed on a horizontal metal interconnection layer stack includes a via hole through one or more dielectric layers, and a conductive metallic plug system in the via hole.

At present, Aluminum and aluminum alloys are widely used as the bulk conductors, and tungsten is widely used as the metal plug for the via in the art of integrated circuit manufacturing.

Structural defects in the system of the interconnecting metal layer stack and the metallic plug in the vias can cause performance and reliability problems in the projected life span of the semiconductor integrated circuit device. One structural defect manifests itself in the form of voids at the interface region between the metallic plug and the metal stack. Application Ser. No. 10/091,789 identifies one root cause of void formation in a tungsten/aluminum system and the solution to the cause. In that invention, a process is described to arrest the metal intrusion from the metal stack into the vias. Application Ser. No. 10/091,789 is hereby incorporated by reference in its entirety.

In this invention, Applicants identify another cause of void formation at the interface of the tungsten plugs and the aluminum metal stack and describes a solution to eliminate or to reduce its harmful effect.

SUMMARY OF THE INVENTION

It is an object of the current invention to provide a method for elimination or reduction of void formation at the bottom of via holes in multilevel integrated circuit devices.

It is an object of the invention to identify the root cause of void formation at the bottom of via holes, and to provide a method for eliminating or reduce the source of the failure.

It is an object of the invention to provide an improved manufacturing process for via formation.

It is an objective of the invention to provide a manufacturing process which does not slow throughput.

It is an object of the invention to provide a method for manufacture of semiconductor devices that improves yield and reliability.

It is an object of the invention to provide a method for elimination or reduction of void formation at the bottom of via holes that is applicable to different metal stacks.

It is an object of the invention to provide an interconnection metallization, including titanium aluminide, wherein good integrity of the via against void formation at the bottom of the via holes is exhibited.

The above and other objectives of the invention will be met by disclosing a process whereby void formation at the bottom of the vias are eliminated or reduced. The thickness of Ti seed layer is controlled, thereby discouraging the reaction between the Ti seed layer and the Aluminum bulk layer to form titanium aluminide compound of which the volume is less than the ingredient titanium and aluminum atoms.

By eliminating or reducing the cause of excessive titanium aluminide, the number and the size of voids at the bottom of the via holes may be eliminated or reduced, and in turn yield and reliability of the device is significantly enhanced. The method is applicable to different metal stacks.

DETAILED DESCRIPTION OF THE DRAWINGS

Figure 1:
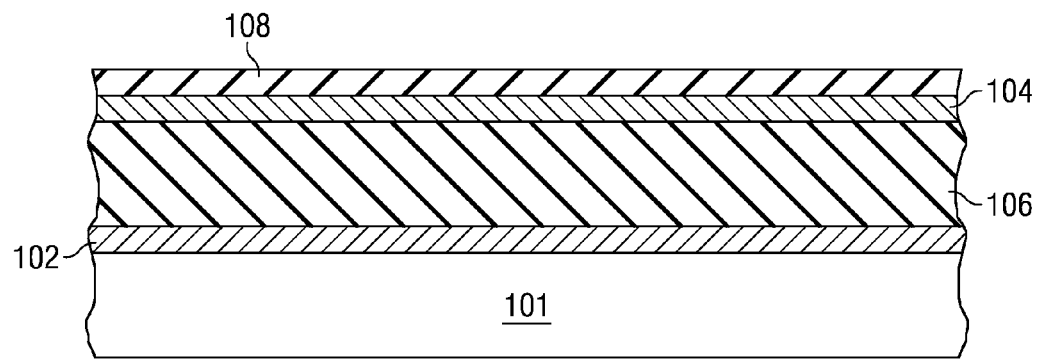
FIG. 1 is a cross sectional view of an interconnecting metal stack as deposited.

FIG. 1 depicts a stack of metal layers in one embodiment of this invention. The metal stack layer is to form a horizontal interconnecting line in a multilayered structure. The aluminum layer 106 is the bulk conductor layer, deposited on the surface of a dielectric layer 101 formed on a semiconductor substrate (not shown). The aluminum layer is sandwiched by a titanium layer 102 on the bottom and a titanium layer 104 on the top.

Overlying the top titanium layer is a titanium nitride layer 108. The primarily function that the titanium nitride layer 108 serves in this structure is an antireflection coating that aids in defining and forming the interconnecting metal line.

Following the photolithography process and the etching process that form the stacked metal line of titanium nitride 108, titanium 104, aluminum 106, and titanium 103, the semiconductor substrate undergoes an annealing process at an elevated temperature. The resulting structure is depicted in FIG. 2.

Figure 2:
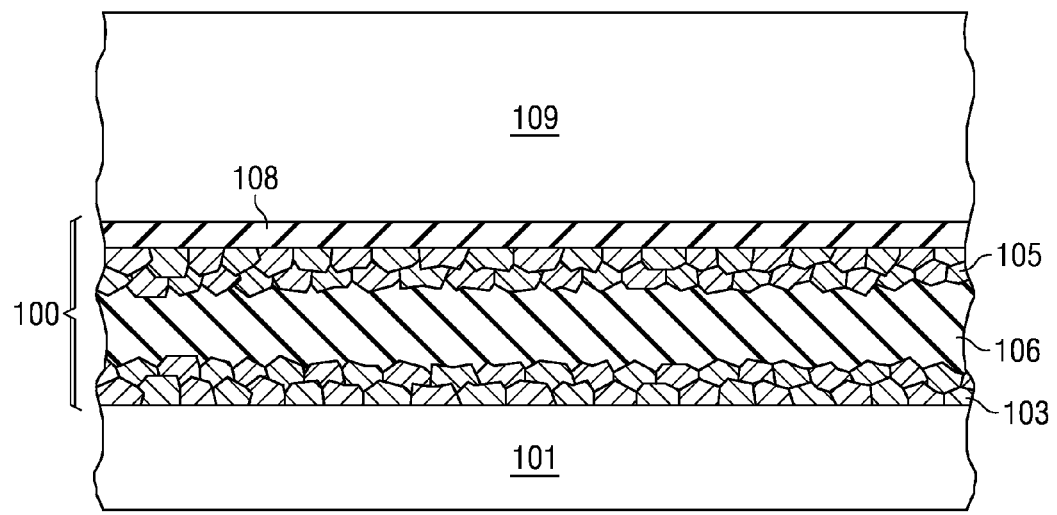
FIG. 2 is a cross section of an interconnecting metal stack post anneal and titanium aluminide formation.

FIG. 2 depicts the result of the annealing process, where the titanium layers and the aluminum layer react to form titanium aluminide (TiAl$_3$) layers 103 and 105. The titanium aluminide layers are advantageous as an etch stop, an electro-migration barrier, and a barrier against aluminum extrusion into vias that are formed later in the manufacturing process.

FIG. 2 also depicts a dielectric layer 109 on top of the titanium nitride layer 108. Vias through which the metal stack 100 is electrically connected to the upper conductive layers (not shown) are formed in the dielectric layer 109 as shown in FIG. 3.

Figure 3:
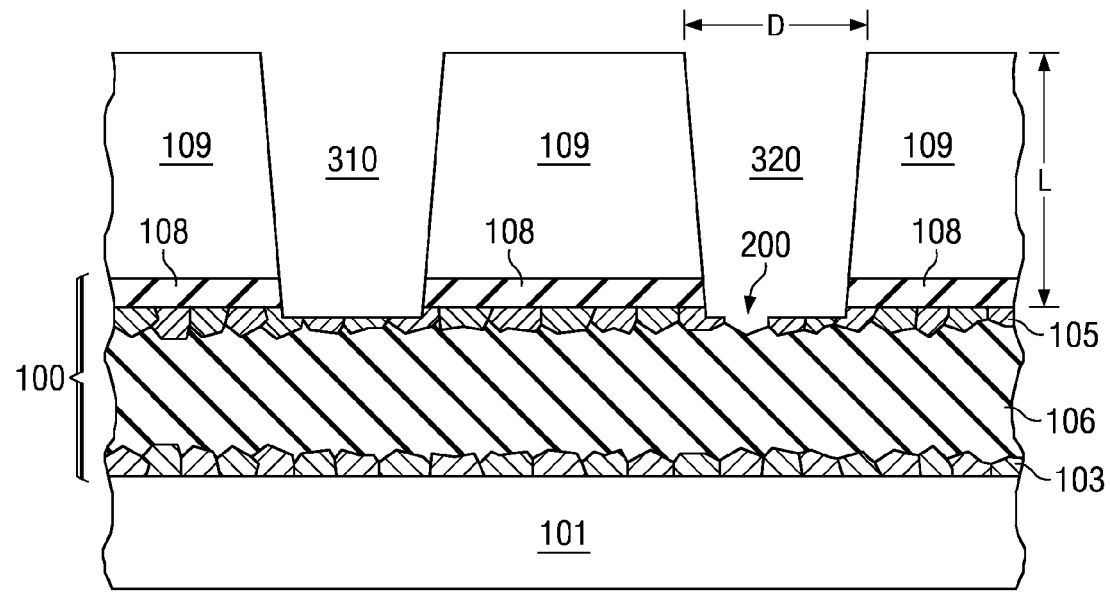
FIG. 3 is a cross section of via formation on the interconnecting metal stack.

FIG. 3 depicts two via holes at the completion of the via etch process. The dimensions in the drawing do not necessarily correspond to any actual via holes and are only for the purpose of illustration. Depending on the design rules, the aspect ratio of via holes, i.e. the ratio of the depth of the via hole l to the diameter of the via hole d, may vary. At present, an integrated circuit device with 0.18 μm design rules may include via holes with aspect ratio ranging from 1.4 to 2.4.

Under a typical manufacturing condition, the via etch process may generate via holes that resemble one or both of the vias in FIG. 3. Via hole 310 in the drawing depicts one type of via holes of which the integrity of the grain structure of the titanium aluminide layer at the bottom of the via hole is preserved and the titanium aluminide layer completely shields the underlying aluminum.

Via hole 320 in the drawing depicts the second type of via holes of which grains of the titanium aluminide layer 105 are missing and the aluminum layer 106 is uncovered at the area of the missing grains. At the bottom of the via holes, the titanium nitride layer 108 is usually removed by the etching process.

Figure 4:
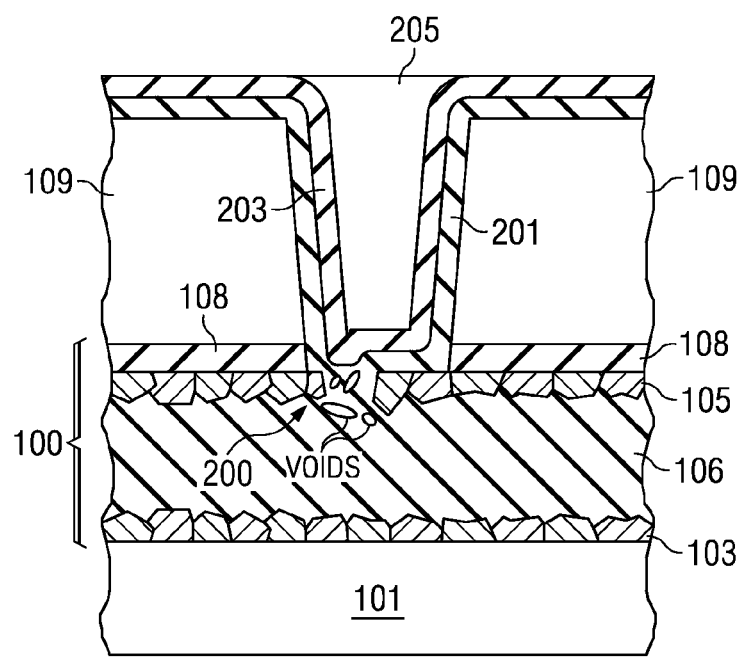
FIG. 4 is a cross section of a via after via metal deposition.

FIG. 4 depicts the portion of the integrated circuit device including via 320 at the completion of via metal deposition. The via metal includes a thin titanium layer 201, a thin titanium nitride layer 203 and a tungsten plug 205.

The titanium nitride layer in this structure serves as a diffusion barrier. The function of the titanium will be described in more detail in the following sections.

Titanium is a chemically active metallic element and serves at least two purposes in this structure.

First, titanium readily bonds with the walls of the via holes and with the surface of the titanium nitride layer 203 and as a result good adhesion between the walls of the via hole and the titanium nitride layer 203 may be achieved.

Secondly, titanium reacts with and reduces metal oxide such as aluminum oxide (Al$_2$O$_3$) that forms at the surface of the metal stack 100 at the bottom of the via holes. In order to form good ohmic contact between the metal stack 100 and the metal in the via, it is critical that the top surface of the metal stack 100 be free of metal oxide film that is non-conducting. It is desirable, therefore, to have sufficient amount of titanium at the bottom of the via hole for the gettering action to take place.

One phenomenon often overlooked by the manufacturers of integrated circuit devices is that this seed titanium layer will readily react with the aluminum layer of the metal stack 100 through any openings in the titanium aluminide layer 105 as depicted in FIG. 3.

It is well known in the art of metallurgy that the size of the titanium aluminide molecule is less than the volume sum of its constituent titanium and aluminum atoms. When the reaction that forms titanium aluminide takes place in a closed area such as at the interface of the metal stack 100 and the bottom of the via 320, a void that is proportional to the volume of formed titanium aluminide will also form.

FIG. 4 depicts such a reaction that forms voids initiated at the area 200 where some grains from the titanium aluminide layer 105 are missing. If the condition is favorable for the reaction to continue, the void will grow in size and excessive growth of the voids will cause the semiconductor integrated circuit device to fail.

If the failure is detected at the integrated circuit manufacturer's factory before it is incorporated into an electronic system, it is counted as a yield loss. More seriously, the void may be small at the initial test stage and escape detection and subsequently, during actual operation in the field, continues to grow and eventually causes of the entire system to fail.

It is discovered by the Applicants that one can detect the existence of voids caused by this mechanism with a simple process of baking the semiconductor substrate and monitoring the value of the via resistance. Baking the semiconductor integrated circuit device at 200° C. for 72 hours is sufficient to reveal the existence and the growth of voids. If the via resistance increases substantially following the baking step, it is evident that the reaction is continuing and a potential via failure exists. As an example, the Applicants discovered that an increase of 0.19 ohms in via resistance following the 72 hour bake almost always indicates a visually (via electron microscopy) detectable void at the bottom of the via.

Two approaches can prevent the failure caused by excessive void growth. The first is to maintain the integrity of the titanium aluminide layer 105 so the titanium layer 201 does not come in direct contact with the underlying aluminum. This approach is not always practical because in order to ensure the completely removed of dielectric material 109 from the via hole, a certain over etch is necessary in at the via etch process and this over-etch often damages the titanium aluminide layer 105, resulting in missing grains at the bottom of the via holes.

A preferable approach to eliminate the over growth of the void is to reduce the amount of the titanium available for the reaction by limiting the thickness of the titanium layer 201.

It is discovered by the Applicants that when the titanium layer 201 is not thicker than about 100 Å, no serious void formation will take place such that the reliability of the semiconductor integrated circuit may be compromised. When the titanium layer 201 is thinner than about 55 Å, the void formation problem can be practically arrested.

What is claimed is:

1. A process for fabricating a semiconductor integrated circuit device, comprising
   a. providing a semiconductor substrate having a top surface and a bottom surface,
   b. forming a first dielectric layer on the top surface of the semiconductor substrate,
   c. forming a metal stack on the surface of the first dielectric layer, the metal stack including
      i. a first intermetallic compound layer include titanium aluminide,
      ii. an metallic layer overlying the first intermetallic compound layer,
      iii. a second intermetallic compound layer include titanium aluminide overlying the metallic layer, and
      iv. a first diffusion barrier layer overlying the second intermetallic compound layer,
   d. forming a second dielectric layer overlying the metal stack and a portion of the first dielectric layer, the second dielectric layer having a top surface,
   e. forming a via region in the second dielectric layer having a wall region and a bottom region, the bottom region being in contact with the second intermetallic compound layer, the via region being free of dielectric material, and f. forming a seed layer overlying at least a portion of the wall region and the bottom region, the thickness of the seed layer being between 40 and 100 angstroms.

2. A process for fabricating semiconductor integrated circuit device according to claim 1, wherein the semiconductor substrate includes silicon material.

3. A process for fabricating semiconductor integrated circuit device according to claim 1, wherein the first layer and the second dielectric layer include silicon dioxide.

4. A process for fabricating semiconductor integrated circuit device according to claim 1, wherein the seed layer includes titanium.

5. A process for fabricating semiconductor integrated circuit device according to claim 1, wherein the seed layer is between 40 and 55 angstroms.

6. A process for fabricating semiconductor integrated circuit device according to claim 1, wherein the metallic layer includes aluminum.

* * * * *